(12) United States Patent
Mizushiro (10) Patent No.: US 9,591,747 B2
(45) Date of Patent: Mar. 7, 2017

(54) MODULE BOARD

(71) Applicant: Murata Manufacturing Co., Ltd., Kyoto-fu (JP)

(72) Inventor: Masaaki Mizushiro, Kyoto-fu (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 413 days.

(21) Appl. No.: 14/201,150

(22) Filed: Mar. 7, 2014

(65) Prior Publication Data

US 2014/0185248 A1   Jul. 3, 2014

Related U.S. Application Data

(63) Continuation of application No. PCT/JP2012/072304, filed on Sep. 3, 2012.

(30) Foreign Application Priority Data

Sep. 9, 2011   (JP) .................................. 2011-196634

(51) Int. Cl.
*H01L 23/52*   (2006.01)
*H05K 1/02*   (2006.01)
(Continued)

(52) U.S. Cl.
CPC ......... *H05K 1/0296* (2013.01); *H01L 21/561* (2013.01); *H01L 21/565* (2013.01);
(Continued)

(58) Field of Classification Search
CPC ......... H01L 23/00; H01L 23/12; H01L 23/48; H01L 23/52; B23K 31/02
(Continued)

(56) References Cited

U.S. PATENT DOCUMENTS 5,432,999 A * 7/1995 Capps ..................... G11C 5/02
                                                            257/E23.011
5,801,447 A * 9/1998 Hirano ................. H01L 21/563
                                                            257/778
(Continued)

FOREIGN PATENT DOCUMENTS

JP   2004-071961 A   3/2004
JP   2005-244143 A   9/2005
(Continued)

OTHER PUBLICATIONS

International Search Report for Application No. PCT/JP2012/072304 dated Sep. 25, 2012.
(Continued)

*Primary Examiner* — David Warren
(74) *Attorney, Agent, or Firm* — Pearne & Gordon LLP (57) ABSTRACT

To provide a module board capable of suppressing depression of a top face of insulating resin near the center of a substrate by arranging multiple columnar connection terminals not only on a peripheral area of the substrate but also between multiple electronic components that are mounted. Multiple electronic components 4 and 4h are mounted on one face of a substrate 5 and the multiple electronic components 4 and 4h are sealed with insulating resin 3. Multiple columnar connection terminals 2 and 7 are arranged on a peripheral area of the substrate 5 and in one or more small areas 8 on the substrate 5, respectively. The one or more small areas 8 are set at positions on the substrate 5, which is not on the peripheral area of the substrate 5 and on which the multiple electronic components 4 and 4h are not mounted.

12 Claims, 7 Drawing Sheets

(51) Int. Cl.
| | |
|---|---|
| H01L 23/00 | (2006.01) |
| H01L 23/12 | (2006.01) |
| H01L 23/48 | (2006.01) |
| H01L 25/04 | (2014.01) |
| H01L 25/18 | (2006.01) |
| H01L 23/31 | (2006.01) |
| H01L 21/56 | (2006.01) |
| H01L 23/498 | (2006.01) |
| H05K 1/18 | (2006.01) |

(52) U.S. Cl.
CPC .............. *H01L 23/00* (2013.01); *H01L 23/12* (2013.01); *H01L 23/3121* (2013.01); *H01L 23/48* (2013.01); *H01L 23/49811* (2013.01); *H01L 23/52* (2013.01); *H01L 25/04* (2013.01); *H01L 25/18* (2013.01); *H05K 1/185* (2013.01); *H01L 24/16* (2013.01); *H01L 2224/0558* (2013.01); *H01L 2224/05568* (2013.01); *H01L 2224/05573* (2013.01); *H01L 2224/16225* (2013.01); *H01L 2224/16227* (2013.01); *H01L 2224/81192* (2013.01); *H01L 2224/81815* (2013.01); *H01L 2224/97* (2013.01); *H01L 2924/12042* (2013.01)

(58) Field of Classification Search
USPC ........... 257/700, 701, 758, 786; 228/180.22; 438/108, 109
See application file for complete search history.

(56) References Cited

U.S. PATENT DOCUMENTS

| | | | | |
|---|---|---|---|---|
| 5,872,051 | A * | 2/1999 | Fallon | B23K 1/0016 228/180.22 |
| 5,886,409 | A * | 3/1999 | Ishino | H01L 23/3107 257/693 |
| 5,894,984 | A * | 4/1999 | Sakai | H01L 23/49816 228/180.22 |
| 6,346,679 | B1* | 2/2002 | Nakamura | H01L 23/49816 174/259 |
| 6,597,070 | B2* | 7/2003 | Miyazaki | H01L 21/561 257/690 |
| 6,927,491 | B1* | 8/2005 | Yamada | H01L 23/49838 257/737 |
| 7,938,311 | B2* | 5/2011 | Marion | H01L 23/49811 228/180.22 |
| 8,106,514 | B2* | 1/2012 | Nakashiba | H01L 21/82387 257/758 |
| 8,148,199 | B2* | 4/2012 | Fjelstad | H01L 23/49811 438/106 |
| 8,344,505 | B2* | 1/2013 | Mclellan | H01L 23/16 257/737 |
| 8,476,775 | B2* | 7/2013 | Yang | H01L 21/4832 257/686 |
| 8,957,530 | B2* | 2/2015 | Shim, II | H01L 21/6835 257/686 |
| 9,202,715 | B2* | 12/2015 | Kim | H01L 21/565 |
| 2002/0017730 | A1* | 2/2002 | Tahara | H01L 23/3114 257/786 |
| 2002/0060367 | A1* | 5/2002 | Ohuchi | H01L 21/563 257/778 |
| 2006/0063312 | A1* | 3/2006 | Kurita | H01L 21/563 438/127 |
| 2006/0170037 | A1* | 8/2006 | Yamauchi | H01L 29/0634 257/330 |
| 2007/0059862 | A1* | 3/2007 | Eng | H01L 21/4857 438/109 |
| 2008/0128893 | A1* | 6/2008 | Uno | H01L 23/3128 257/700 |
| 2008/0136004 | A1* | 6/2008 | Yang | H01L 24/96 257/686 |
| 2008/0150101 | A1* | 6/2008 | White | H01L 23/3121 257/668 |
| 2008/0237834 | A1* | 10/2008 | Hu | H01L 21/6835 257/693 |
| 2009/0008762 | A1 | 1/2009 | Jung | |
| 2009/0014871 | A1* | 1/2009 | Meyer | B81C 1/00301 257/737 |
| 2011/0062584 | A1* | 3/2011 | Ishihara | H01L 21/486 257/737 |
| 2011/0133185 | A1* | 6/2011 | Wakisaka | H01L 22/34 257/48 |
| 2011/0169150 | A1* | 7/2011 | Su | H01L 21/4857 257/675 |
| 2012/0320536 | A1* | 12/2012 | Yamamoto | H01L 21/561 361/728 |
| 2014/0008789 | A1* | 1/2014 | Cho | H01L 23/49811 257/737 |
| 2015/0035161 | A1* | 2/2015 | Miao | H01L 23/5283 257/774 |
| 2015/0145142 | A1* | 5/2015 | Lin | H01L 25/50 257/774 |
| 2015/0179551 | A1* | 6/2015 | Nakamura | H01L 23/481 257/773 |
| 2015/0380338 | A1* | 12/2015 | Hori | H01L 25/07 257/693 |
| 2016/0064347 | A1* | 3/2016 | Kuo | H01L 23/488 438/108 |

FOREIGN PATENT DOCUMENTS

| | | |
|---|---|---|
| JP | 3960479 B1 | 8/2007 |
| JP | 2007-287762 A | 11/2007 |
| JP | 2007-287803 A | 11/2007 |
| JP | 2009-016786 A | 1/2009 |
| JP | 2009-170802 A | 7/2009 |
| JP | 2009266994 A * | 11/2009 |
| JP | 2010-245157 A | 10/2010 |
| KR | 10-2009-0002573 A | 1/2009 |
| TW | 200903754 A | 1/2009 |

OTHER PUBLICATIONS

Written Opinion of the International Searching Authority for Application No. PCT/JP2012/072304 dated Sep. 25, 2012.

* cited by examiner

MODULE BOARD

BACKGROUND OF THE INVENTION

Field of the Invention

The present invention relates to a module board in which multiple electronic components are mounted on one face of a substrate and the multiple electronic components are sealed with an insulating resin. In particular, the present invention relates to a module board in which multiple columnar connection terminals are arranged not only on a peripheral area of a substrate but also between the multiple electronic components that are mounted.

Description of the Related Art

Many circuit boards have hitherto been developed in which multiple columnar posts are formed on the peripheral areas of substrates and the columnar posts are exposed from the top face of an insulating resin with which inner connection electrodes are sealed to use the columnar posts as outer electrodes. For example, Patent Document 1 discloses a method of manufacturing a semiconductor integrated circuit device in which columnar conductive posts are arranged on a peripheral area of a wiring substrate on which a semiconductor chip is installed and a part of the conductive posts is exposed from a resin sealing portion with which the wiring substrate is sealed to form outer electrodes.

Patent Document 2 discloses a method of manufacturing a semiconductor apparatus in which multiple columnar or rod-shaped internal connection electrodes are fixed on a peripheral area of an organic substrate having circuit elements arranged thereon so that a connecting plate turns up, the internal connection electrodes are sealed with resin so that the connecting plate is covered with the resin, the surfaces of the internal connection electrodes that are sealed with the resin are abraded or ground at least until the connecting plate is abraded off for flattening, and the internal connection electrodes are exposed to use the internal connection electrodes that are exposed as outer connection electrodes.

Patent Document 1: Japanese Unexamined Patent Application Publication No. 2007-287762

Patent Document 2: Japanese Patent No. 3960479

Patent Document 3: Japanese Unexamined Patent Application Publication No. 2004-071961

BRIEF SUMMARY OF THE INVENTION

However, the multiple columnar posts (the internal connection electrodes) are formed only on the peripheral area of the substrate in each of the arrangements in Patent Document 1 and Patent Document 2. Accordingly, when the insulating resin, such as a sealing material or a molding material, for sealing the electronic components or the likes that are mounted inside the columnar posts is injected into, the insulating resin is likely to be accumulated around the columnar posts arranged on the peripheral area of the substrate to possibly make the insulating resin thin near the center of the substrate where no columnar post is arranged. When the thickness of the insulating resin is made small near the center of the substrate, there is a problem in that it is difficult to flatten the insulating resin to cause the accumulation of flux resin or the air entrainment, etc. in the mounting on a mounting substrate.

In addition, for example, Patent Document 3 discloses a method of manufacturing a combined module in which columnar posts are arranged also in portions other than the peripheral area of the substrate. However, the columnar posts are only scattered in order to improve the sealing effect and the possibility of reducing the thickness of the insulating resin near the center of the substrate where no columnar post is arranged is not cleared.

In order to resolve the above problems, it is an object of the present invention to provide a module board capable of suppressing the depression of the top face of an insulating resin near the center of a substrate by arranging multiple columnar connection terminals not only on a peripheral area of the substrate but also between multiple electronic components that are mounted.

In order to achieve the above object, the present invention provides a module board including a substrate one face of which has multiple electronic components mounted thereon. The multiple electronic components are sealed with an insulating resin. In the module board, multiple columnar connection terminals are arranged on a peripheral area of the substrate and in one or more small areas on the substrate. The one or more small areas are set at positions on the substrate, which are not on the peripheral area of the substrate and on which the multiple electronic components are not mounted.

In the above arrangement, the multiple electronic components are mounted on one face of the substrate and the multiple electronic components are sealed with the insulating resin. The multiple columnar connection terminals are arranged on the peripheral area of the substrate and in one or more small areas on the substrate. The one or more small areas are set at positions on the substrate, which are not on the peripheral area of the substrate and on which the multiple electronic components are not mounted. Accordingly, it is possible to suppress the depression of the top face of the insulating resin near the center of the substrate to simplify or omit a process of flattening the insulating resin. In addition, since the depression of the top face of the insulating resin is suppressed near the center of the substrate, the flux resin is not accumulated on the top face of the insulating resin to suppress an occurrence of, for example, the air entrainment when the module board is mounted on the mounting substrate.

In the module board according to the present invention, the small area is preferably set between the multiple electronic components.

In the above arrangement, since the small area is set between the multiple electronic components, it is possible to effectively suppress the depression of the top face of the insulating resin to simplify or omit the process of flattening the insulating resin. In addition, since the depression of the top face of the insulating resin is suppressed, the flux resin is not accumulated on the top face of the insulating resin to suppress an occurrence of, for example, the air entrainment when the module board is mounted on the mounting substrate.

In the module board according to the present invention, the columnar connection terminals are preferably arranged in the small area so that the distance between the electronic component that is short and the columnar connection terminal most adjacent to the electronic component that is short is shorter than the distance between the electronic component that is high and the columnar connection terminal most adjacent to the electronic component that is high.

In the above arrangement, the columnar connection terminals are arranged in the small area so that the distance between the electronic component that is short and the columnar connection terminal most adjacent to the electronic component that is short is shorter than the distance between the electronic component that is high and the columnar connection terminal most adjacent to the electronic component that is high. Since the distance between the electronic component that is short and the columnar connection terminal most adjacent to the electronic component that is short is reduced, the top face of the insulating resin, which is likely to be depressed near the electronic component that is short, is effectively kept flat. As a result, it is possible to suppress the depression of the top face of the insulating resin near the center of the substrate to simplify or omit the process of flattening the insulating resin.

In the module board according to the present invention, the small area is preferably set at a position farthest from the columnar connection terminals arranged on the peripheral area of the substrate.

In the above arrangement, since the small area is set at a position farthest from the multiple columnar connection terminals arranged on the peripheral area of the substrate, the top face of the insulating resin, which is more likely to be depressed with the increasing distance from the columnar connection terminals arranged on the peripheral area of the substrate, is effectively kept flat. As a result, it is possible to suppress the depression of the top face of the insulating resin near the center of the substrate to simplify or omit the process of flattening the insulating resin.

In the module board according to the present invention, it is preferred that the substrate have a rectangular shape and that the small area be set at a position including an intersection point of diagonal lines of the substrate.

In the above arrangement, since the substrate has a rectangular shape and the small area is set at a position including the intersection point of the diagonal lines of the substrate, the top face of the insulating resin, which is likely to be depressed near the center of the substrate farthest from the columnar connection terminals arranged on the peripheral area of the substrate, is effectively kept flat. As a result, it is possible to suppress the depression of the top face of the insulating resin near the center of the substrate to simplify or omit the process of flattening the insulating resin.

In the module board according to the present invention, the multiple columnar connection terminals are preferably arranged in a cross pattern in the small area.

In the above arrangement, since the multiple columnar connection terminals are arranged in the cross pattern in the small area, the top face of the insulating resin, which is likely to be depressed in a periphery of the multiple columnar connection terminals, is effectively kept flat. As a result, it is possible to suppress the depression of the top face of the insulating resin near the center of the substrate to simplify or omit the process of flattening the insulating resin.

In the module board according to the present invention, the multiple columnar connection terminals are preferably connected to ground electrode.

In the above arrangement, since the multiple columnar connection terminals are connected to the ground electrode, poor grounding is not likely to occur to improve the module features.

In the module board according to the present invention, the small area is preferably set at a position adjacent to the electronic components the operation of which is varied with heat.

In the above arrangement, since the small area is set at a position adjacent to the electronic components the operation of which is varied with heat, the radiation is improved to prevent failure of the electronic components due to the heat from occurring.

In the module board according to the present invention, the insulating resin preferably has a top face that is flat.

In the above arrangement, since the top face of the insulating resin is flat, it is possible to simplify or omit the process of flattening the insulating resin. The flux resin is not accumulated on the top face of the insulating resin to suppress an occurrence of, for example, the air entrainment when the module board is mounted on the mounting substrate.

In the module board according to the present invention, the multiple electronic components are preferably mounted on the other face of the substrate.

In the above arrangement, since the multiple electronic components are mounted also on the other face of the substrate, it is possible to achieve the higher mounting density of the electronic components to reduce the size of the module board.

With the above arrangements, it is possible to suppress the depression of the top face of the insulating resin near the center of the substrate to simplify or omit the process of flattening the insulating resin. In addition, since the depression of the top face of the insulating resin is suppressed near the center of the substrate, the flux resin is not accumulated on the top face of the insulating resin to suppress an occurrence of, for example, the air entrainment when the module board is mounted on the mounting substrate.

DETAILED DESCRIPTION OF THE INVENTION

Figure 7:
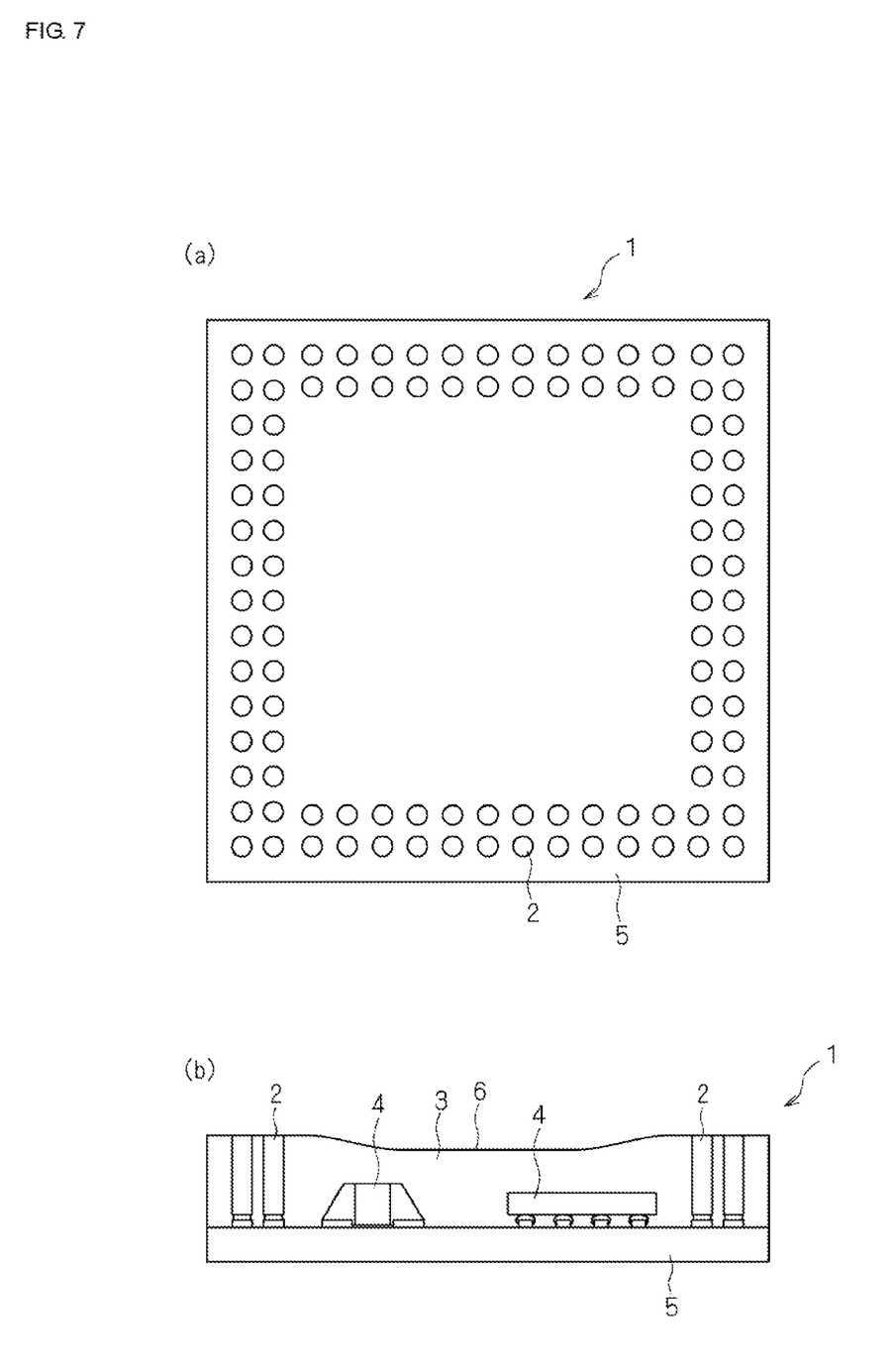
FIGS. 7(a) and 7(b) include a plan view and a cross-sectional view illustrating an arrangement of a module board in related art, respectively.

Embodiments of the present invention will herein be described in detail with reference to the attached drawings. FIG. 7 includes a plan view and a cross-sectional view illustrating an arrangement of a module board in the related art. FIG. 7(a) is a plan view of a module board 1 in the related art. In the module board 1, multiple columnar connection terminals 2 are arranged on a peripheral area of a substrate 5. FIG. 7(b) is a cross-sectional view of the module board 1 in the related art. Referring to FIG. 7(b), the heights of the multiple columnar connection terminals 2 from one face of the substrate 5 are made greater than those of electronic components (surface mount devices (SMDs)) 4 from the one face of the substrate 5.

When the electronic components 4 that are mounted are sealed with insulating resin 3, a top face 6 of the insulating resin 3 is kept flat near the multiple columnar connection terminals 2 arranged on the peripheral area of the substrate 5. However, the top face 6 of the insulating resin 3 is depressed with the increasing distance from the multiple columnar connection terminals 2 arranged on the peripheral area of the substrate 5, and as a result, the top face 6 of the insulating resin 3 near the center of the substrate 5 is depressed. As a result, it is difficult to flatten the top face 6 of the insulating resin 3, that is, it is difficult to perform the flattening, which causes the accumulation of the flux resin or the air entrainment, etc. in the mounting on a mounting substrate.

Figure 1:
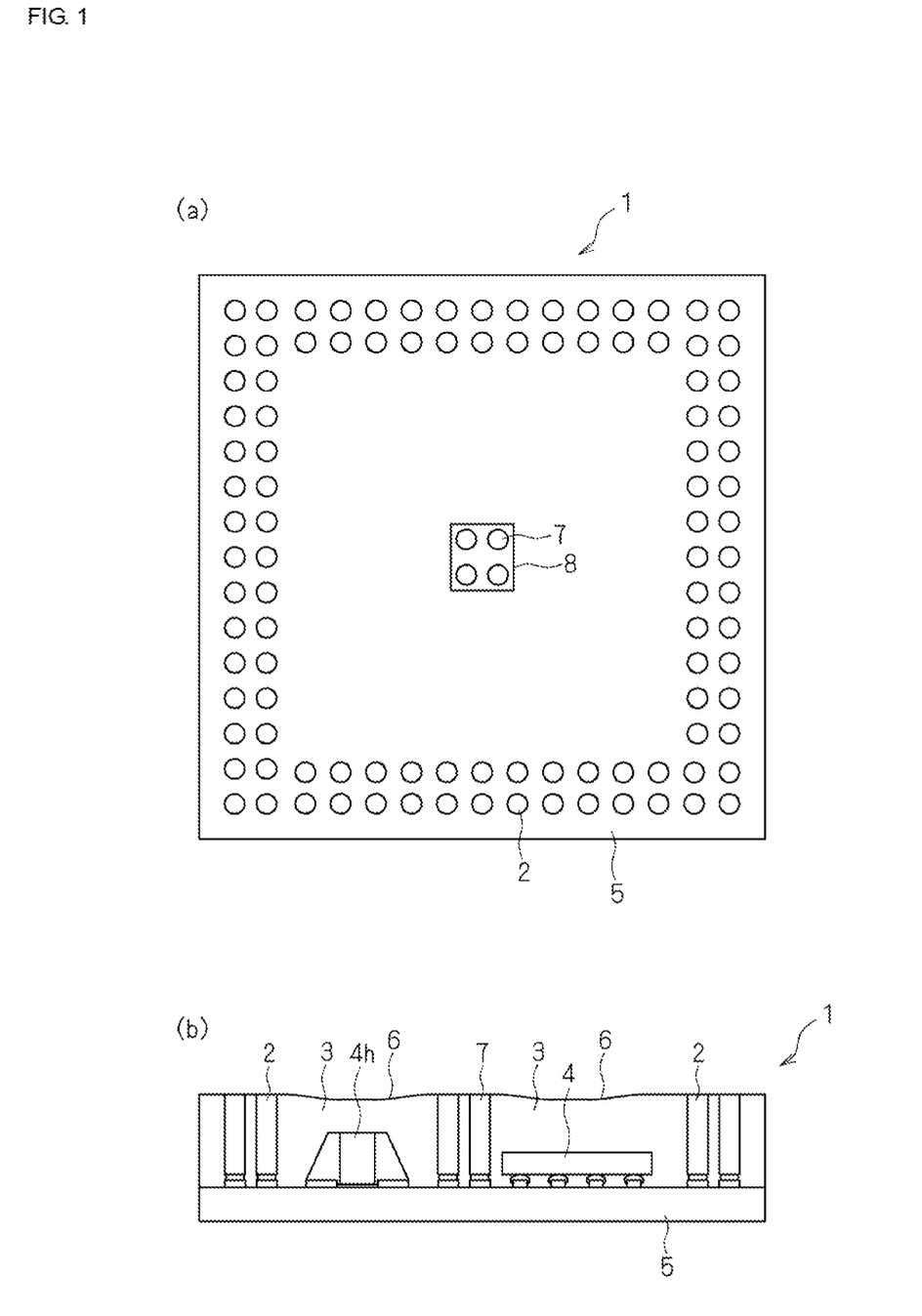
FIGS. 1(a) and 1(b) include a plan view and a cross-sectional view illustrating an arrangement of a module board according to an embodiment of the present invention, respectively.

In order to resolve the above problems, in an embodiment, the multiple columnar connection terminals are arranged also at positions on the substrate 5 other than the peripheral area of the substrate 5 and areas on which the electronic components 4 are mounted. FIG. 1 includes a plan view and a cross-sectional view illustrating an arrangement of a module board 1 according to the embodiment of the present invention. FIG. 1(*a*) is a plan view of the module board 1 according to the embodiment of the present invention. In the module board 1, multiple columnar connection terminals 2 are arranged on a peripheral area of a substrate 5 and multiple columnar connection terminals 7 are arranged also in a small area 8 near the center of the substrate 5. Although the small area 8 is represented by a border line for description in FIG. 1(*a*), the border line is a virtual line. The same applies to the other drawings. FIG. 1(*b*) is a cross-sectional view of the module board 1 according to the embodiment of the present invention. Referring to FIG. 1(*b*), the heights of the multiple columnar connection terminals 2 and 7 from one face of the substrate 5 are made greater than those of electronic components (SMDs) 4 and 4*h* from the one face of the substrate 5.

Accordingly, a top face 6 of insulating resin 3 is kept flat not only near the columnar connection terminals 2 arranged on the peripheral area of the substrate 5 but also near the multiple columnar connection terminals 7 arranged in the small area 8 set at the position which is near the center of the substrate 5 and on which the electronic components 4 and 4*h* are not mounted. In other words, the depression of the top face 6 of the insulating resin 3 is suppressed even at a position away from the multiple columnar connection terminals 2 arranged on the peripheral area of the substrate 5, for example, even near the center of the substrate 5 to keep the top face 6 of the insulating resin 3 flat or substantially flat. Accordingly, it is possible to simplify or omit a process of flattening the insulating resin 3. In addition, since the depression of the top face 6 of the insulating resin 3 is suppressed near the center of the substrate 5, the flux resin is not accumulated on the top face 6 of the insulating resin 3 to suppress an occurrence of, for example, the air entrainment when the module board 1 is mounted on a mounting substrate.

Although one small area 8 is set in the example in FIG. 1, the effect of suppressing the depression of the top face 6 of the insulating resin 3 near the center of the substrate 5 is practically reduced by half unless multiple small areas 8 are set. Accordingly, the multiple small areas 8 in which the multiple columnar connection terminals 7 are arranged are preferably set at positions on the substrate 5, which are not on the peripheral area of the substrate 5 and on which the electronic components 4 and 4*h* are not mounted.

Figure 2:
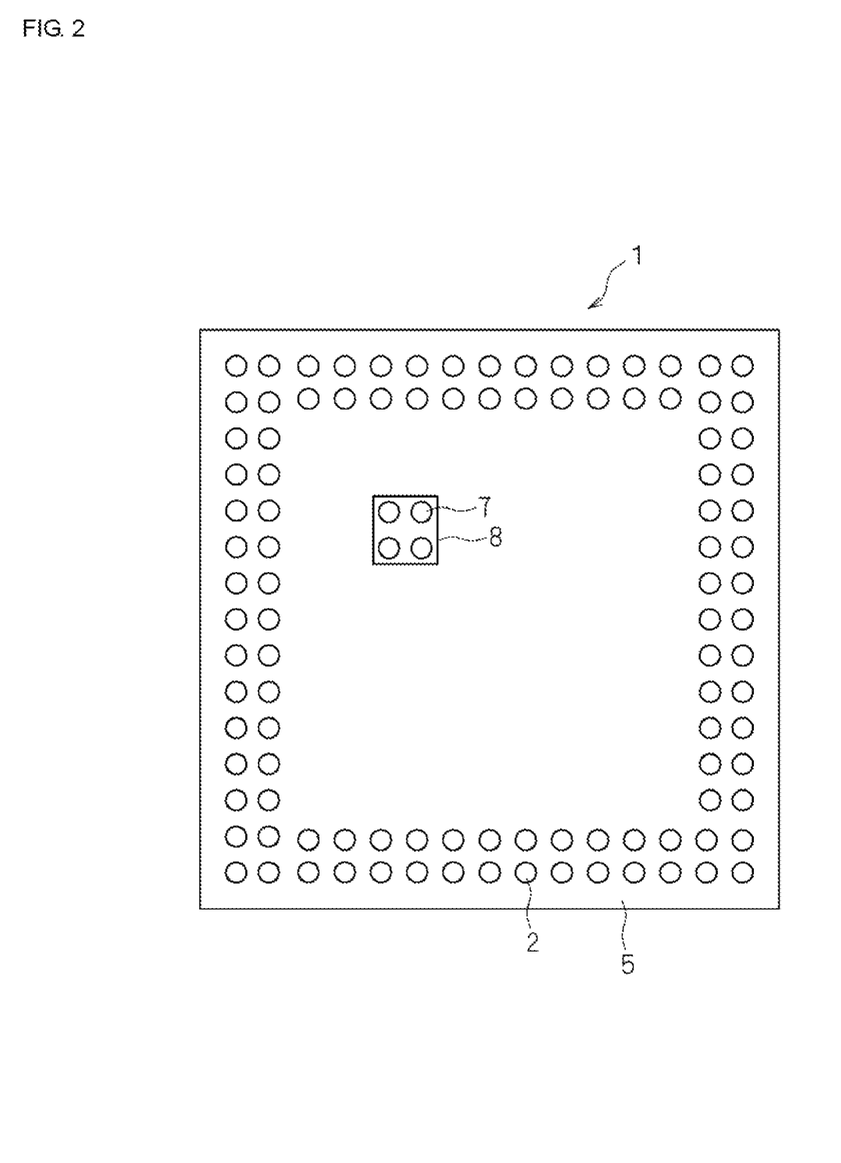
FIG. 2 is a plan view illustrating another arrangement of the module board according to an embodiment of the present invention.

The small area 8 is not limitedly set near the center of the substrate 5 and it is sufficient for the small area 8 to be set at a position on the substrate 5, which is not on the peripheral area of the substrate 5 and on which the electronic components 4 and 4*h* are not mounted. FIG. 2 is a plan view illustrating another arrangement of the module board 1 according to an embodiment of the present invention.

As illustrated in FIG. 2, the small area 8 may be set at any position on the substrate 5, which is not near the center of the substrate 5, which is not on the peripheral area of the substrate 5, and on which the electronic components 4 and 4*h* are not mounted. For example, the small area 8 may be set between the electronic component 4 and the electronic component 4*h* or between the electronic component 4 or 4*h* and the multiple columnar connection terminals 2 arranged on the peripheral area of the substrate 5. For example, setting the small area 8 between the adjacent electronic components 4 and 4*h* allows the depression of the top face 6 of the insulating resin 3 to be effectively suppressed.

Figure 3:
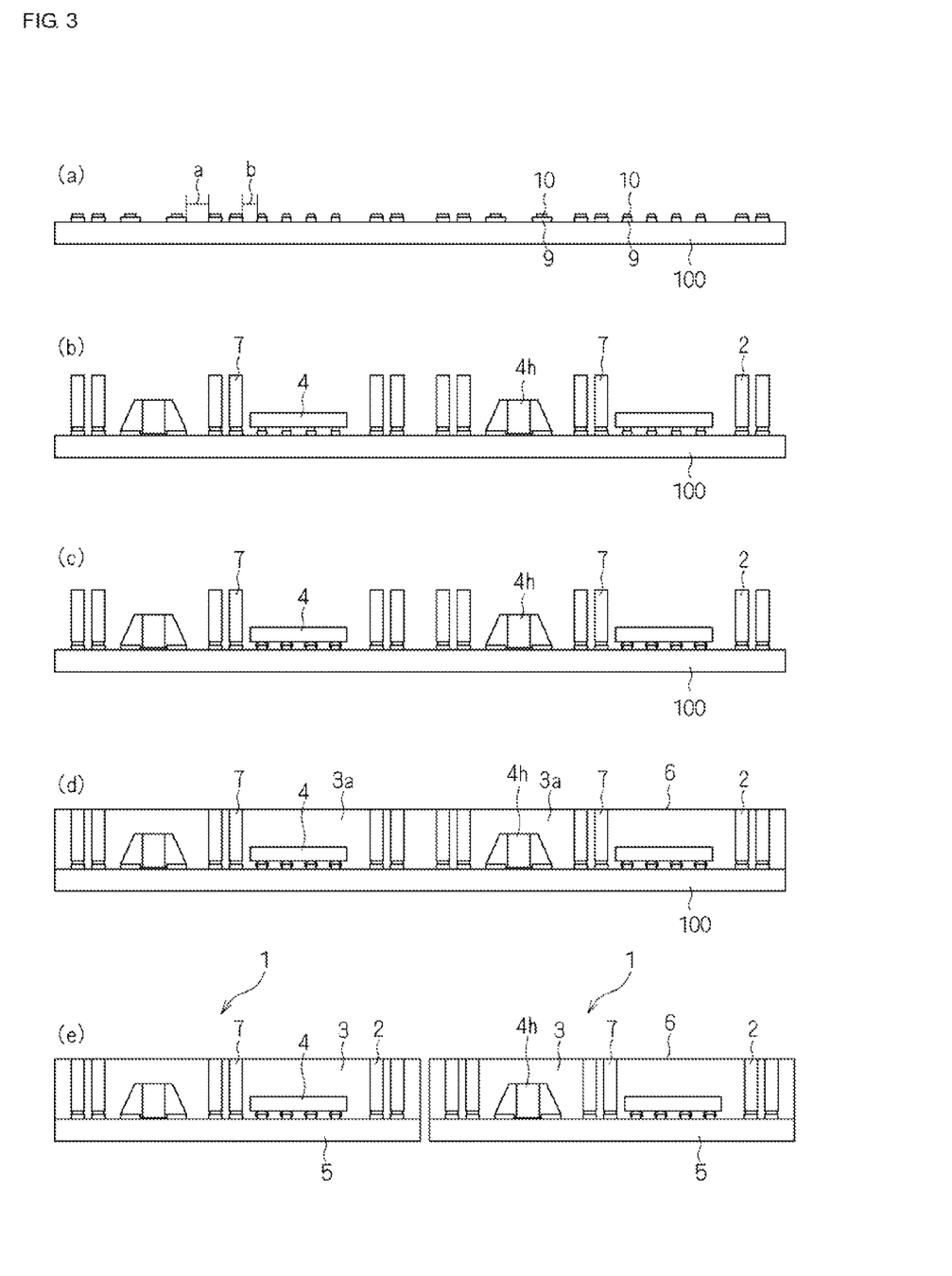
FIGS. 3(a)-(e) include cross-sectional views illustrating a process of manufacturing the module board according to an embodiment of the present invention.

If the height of the electronic component 4 is different from that of the electronic component 4*h*, the multiple columnar connection terminals 7 are preferably arranged so that the distance between the electronic component 4 that is shorter in heights and the columnar connection terminal 7 most adjacent to the electronic component 4 (denoted by b in FIG. 3(*a*)) is less than the distance between the electronic component 4*h* that is higher in heights and the columnar connection terminal 7 most adjacent to the electronic component 4*h* (denoted by a in FIG. 3(*a*)). Since the distance between the electronic component 4 that is shorter and the columnar connection terminal 7 most adjacent to the electronic component 4 is made less, the top face 6 of the insulating resin 3, which is likely to be depressed near the electronic component 4 that is shorter, is effectively kept flat to suppress the depression of the top face 6 of the insulating resin 3.

FIG. 3 includes cross-sectional views illustrating a process of manufacturing the module board 1 according to an embodiment of the present invention. First, as illustrated in FIG. 3(*a*), solder 10 is printed on a desired surface electrode 9, among surface electrodes 9 on a collective board 100 having a rectangular outline. The collective board 100 is, for example, a Low Temperature Co-fired Ceramics (LTCC) substrate or an organic substrate and is not specifically limited.

In the manufacturing of the collective board 100 as the LTCC substrate, a polyethylene terephthalate (PET) film is coated with ceramic slurry and the ceramic slurry is dried to manufacture a ceramic green sheet having a thickness of 10 μm to 200 μm. Via holes each having a diameter of 0.1 mm are formed from the PET film side in the ceramic green sheet with a die, laser light, or the like.

Next, the via holes are filled with electrode paste in which metal powder containing silver or copper as the main ingredient, resin, and organic solvent are kneaded with each other and the electrode paste is dried. Equivalent electrode paste is applied by screen-printing or the like on the ceramic green sheet in a desired pattern to be dried.

Multiple ceramic green sheets are stacked in this state and are pressure-bonded at a pressure of 100 kg/cm$^2$ to 1,500 kg/cm$^2$ and at a temperature of 40° C. to 100° C. Then, the multiple ceramic green sheets are fired in the air at substantially 850° C. when the electrode paste contains silver as the main ingredient and are fired in nitrogen atmosphere at substantially 950° C. when the electrode paste contains copper as the main ingredient and a film made of Ni/Sn, Ni/Au, etc. is formed on the electrode by wet plating or the like to manufacture the collective board 100.

Next, as illustrated in FIG. 3(*b*), the multiple electronic components 4 and 4*h* are arranged on the surface electrodes 9 on which the solder 10 is applied and the multiple columnar connection terminals 2 are arranged on the surface electrodes 9 corresponding to the peripheral area of the substrate 5 when the collective board 100 is separated into the module boards 1. The multiple columnar connection terminals 7 are arranged in the small areas 8 on the substrate 5, which are not on the peripheral area of the substrate 5 and which are set at positions on which the electronic components 4 and 4*h* is not mounted when the collective board 100 is separated into the module boards 1.

Next, as illustrated in FIG. 3(*c*), the solder 10 that is applied is melted by using a reflow apparatus to connect the electronic components 4 and 4*h* and the multiple columnar connection terminals 2 and 7 that are arranged to the collective board 100. An organic material, such as excess flux, is removed with a wet cleaning apparatus or a dry cleaning apparatus.

Next, as illustrated in FIG. 3(*d*), the collective board 100 is laminated with a resin sheet (insulating resin) 3*a*. A sheet resulting from molding and semi-hardening of composite resin on the PET film is used as the resin sheet 3*a*. The composite resin is a composite material in which a thermosetting resin, such as epoxy resin, phenol resin, or cyanate resin, is mixed with an inorganic filler made of, for example, $Al_2O_3$, $SiO_2$, or $TiO_2$. In the lamination with the resin sheet 3*a*, a spacer having a desired thickness is arranged around the collective board 100 to cause the resin sheet 3*a* with which the collective board 100 is laminated to have the desired thickness. The collective board 100 in this state is put into an oven to completely harden the resin sheet 3*a*, thereby the electronic components 4 and 4*h* are sealed with the insulating resin 3.

Only one face of the collective board 100 is laminated with the resin sheet 3*a* to be hardened in the above manner in the present embodiment. However, when the electronic components 4 and 4*h* are mounted on both faces of the collective board 100, one face and the other face of the collective board 100 may be separately laminated to be hardened or both the one face and the other face of the collective board 100 may be collectively laminated to be hardened.

The top face 6 of the insulating resin 3 with which the electronic components 4 and 4*h* are sealed is ground with, for example, a roller-type blade (not illustrated). Even if the heights of the multiple columnar connection terminals 2 and 7 are varied depending on the difference of the connection state of the solder 10 or the like, the grinding of the top face 6 of the insulating resin 3 causes the cross-sectional shapes of the multiple columnar connection terminals 2 exposed from the top face 6 of the insulating resin 3 to substantially coincide with the cross-sectional shapes of the multiple columnar connection terminals 7 exposed therefrom. Accordingly, it is possible to reliably connect the module board 1 on the mounting substrate.

Finally, as illustrated in FIG. 3(*e*), the collective board 100 is divided with, for example, a dicing machine to separate the collective board 100 into the module boards 1. A shielding layer made of, for example, conductive paste may be formed on the separated module boards 1.

As described above, according to the embodiments, the depression of the top face 6 of the insulating resin 3 is suppressed near the center of the substrate 5 to simplify or omit the process of flattening the insulating resin 3. In addition, since the depression of the top face 6 of the insulating resin 3 is suppressed near the center of the substrate 5, the flux resin is not accumulated on the top face 6 of the insulating resin 3 to suppress an occurrence of, for example, the air entrainment when the module board 1 is mounted on the mounting substrate.

The multiple columnar connection terminals 2 and 7 may be connected to ground electrode. In this case, since the module board 1 is grounded via a short path not via the shielding layer, poor grounding is not likely to occur to improve the module features.

Although it is sufficient for one or more small areas 8 in which the multiple columnar connection terminals 7 are arranged to be set at positions on the substrate 5, which are not on the peripheral area of the substrate 5 and on which the electronic components 4 and 4*h* are not mounted, one or more small areas 8 are preferably set near the center of the substrate 5. This is because, for example, the top face 6 of the insulating resin 3 is more likely to be depressed with the increasing distance from the multiple columnar connection terminals 2 arranged on the peripheral area of the substrate 5 and setting the small area 8 near the center of the substrate 5 allows the depression of the top face 6 of the insulating resin 3 to be suppressed near the center of the substrate 5.

Specifically, the small area 8 is preferably set at a position including the intersection point of the diagonal lines of the rectangular substrate 5. In this case, the top face 6 of the insulating resin 3, which is more likely to be depressed with the increasing distance from the multiple columnar connection terminals 2 arranged on the peripheral area of the substrate 5, is effectively kept flat. As a result, the depression of the top face 6 of the insulating resin 3 is suppressed near the center of the substrate 5 to simplify or omit the process of flattening the insulating resin 3.

Figure 4:
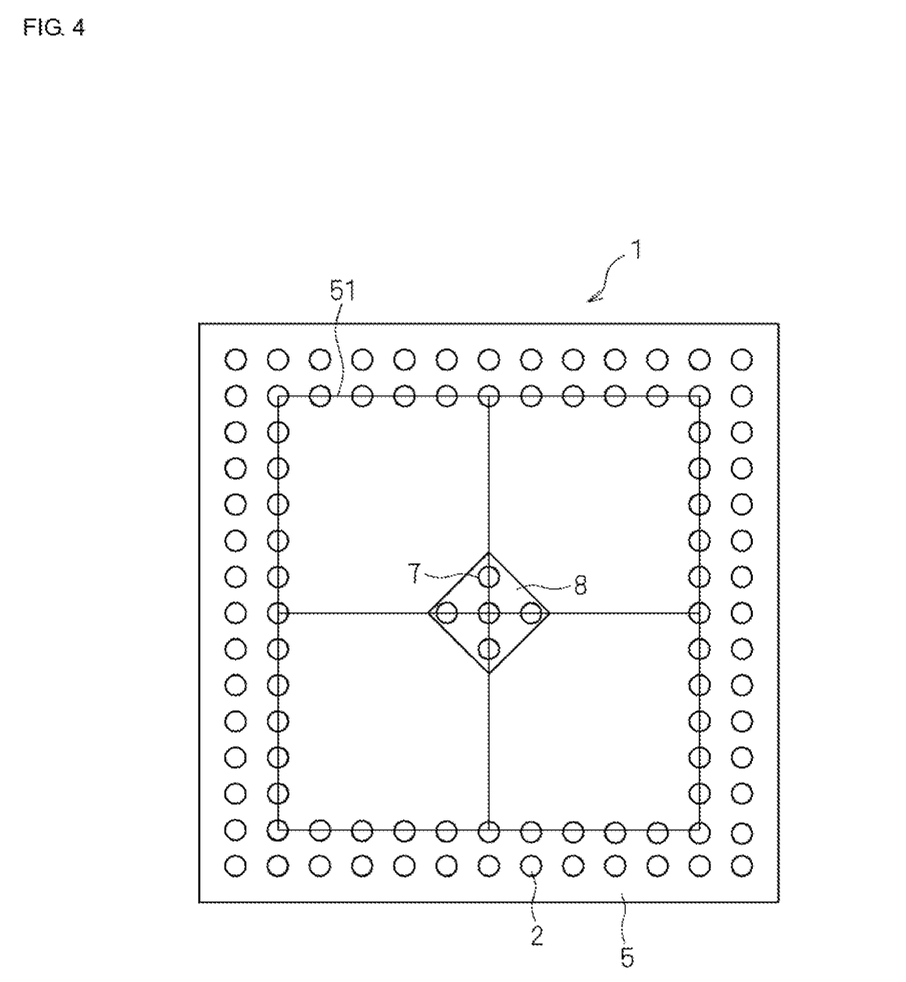
FIG. 4 is a plan view illustrating another arrangement of the module board according to an embodiment of the present invention.

FIG. 4 is a plan view illustrating another arrangement of the module board 1 according to an embodiment of the present invention. As illustrated in FIG. 4, the small area 8 is set at a position including the intersection point of the diagonal lines of the rectangular substrate 5 and the multiple columnar connection terminals 7 are arranged in the small area 8 in a cross pattern. Since the multiple columnar connection terminals 7 are arranged in the small area 8 in the cross pattern, the top face 6 of the insulating resin 3, which is likely to be depressed in a periphery of the multiple columnar connection terminals 7, is effectively kept flat. The arrangement of the multiple columnar connection terminals 7 in the cross pattern allows an area surrounded by the multiple columnar connection terminals 2 arranged on the peripheral area of the substrate 5 to be divided into apparent small cells 51. Accordingly, the surface tension of the insulating resin 3, which is applied to the multiple columnar connection terminals 2 arranged on the peripheral area of the substrate 5, is dispersed to the respective small cells 51. As a result, the depression of the top face 6 of the insulating resin 3 is wholly suppressed to simplify or omit the process of flattening the insulating resin 3. Although the cells 51 are represented by border lines for simplicity in the description in FIG. 4, the border lines are virtual lines.

The small area 8 is not limitedly set at a position including the intersection point of the diagonal lines of the rectangular substrate 5 and, for example, when the substrate 5 does not have a rectangular shape, the small area 8 may be set at a position farthest from the multiple columnar connection terminals 2 arranged on the peripheral area of the substrate 5. This is because, in this case, the top face 6 of the insulating resin 3, which is more likely to be depressed with the increasing distance from the multiple columnar connection terminals 2 arranged on the peripheral area of the substrate 5, is effectively kept flat to suppress the depression of the top face 6 of the insulating resin 3.

Furthermore, the small area 8 is preferably set at a position adjacent to the electronic component 4 or 4h, such as an integrated circuit (IC), the operations of which are varied with heat. In this case, since the heat that is generated is likely to escape through the multiple columnar connection terminals 7, the radiation from the electronic components 4 and 4h is improved to prevent failure of the electronic components 4 and 4h due to the heat from occurring.

Figure 5:
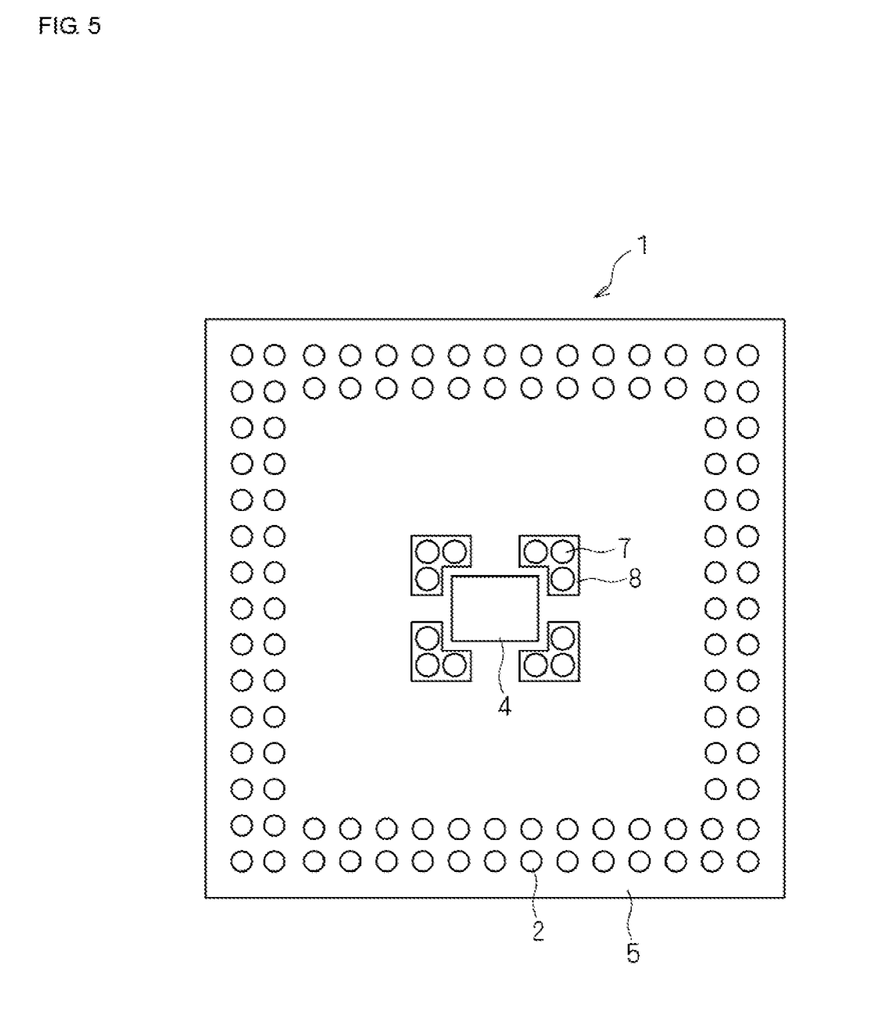
FIG. 5 is a plan view illustrating another arrangement of the module board according to an embodiment of the present invention.

FIG. 5 is a plan view illustrating another arrangement of the module board 1 according to an embodiment of the present invention. In the module board 1 illustrated in FIG. 5, the electronic component 4 the operation of which is varied with heat, for example, an IC is arranged near the center of the substrate 5. Four small areas 8 are set in an L-letter pattern so as to surround the electronic component 4 and three columnar connection terminals 7 are arranged in each small area 8. Since the small areas 8 are arranged at the positions adjacent to the electronic component 4 the operation of which is varied with heat, any heat that is generated in the electronic component 4 easily escapes through the multiple columnar connection terminals 7 to prevent failure of the electronic component 4 due to the heat from occurring.

The present invention is not limited to the above embodiments and various modifications and substitution may be made within the spirit and scope of the present invention. For example, although the case in which the electronic components 4 and 4h are mounted on one face of the substrate 5 is described in the above embodiments, the mounting of the electronic components 4 and 4h is not limited to the above one and the electronic components 4 and 4h may be mounted on both face of the substrate 5.

Figure 6:
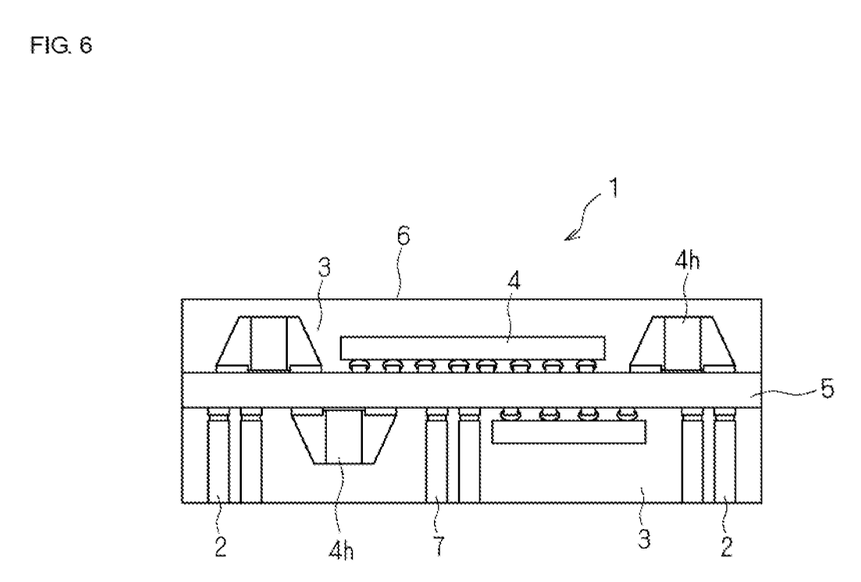
FIG. 6 is a cross-sectional view illustrating an arrangement of the module board according to an embodiment of the present invention when electronic components are mounted on both faces.

FIG. 6 is a cross-sectional view illustrating an arrangement of the module board 1 according to an embodiment of the present invention when the multiple electronic components 4 and 4h are mounted on both faces of the substrate 5. As illustrated in FIG. 6, the multiple electronic components 4 and 4h are mounted on both faces of the substrate 5 and both faces of the substrate 5 are sealed with the insulating resin 3.

The multiple columnar connection terminals 2 and 7 via which the module board 1 is connected to the mounting substrate are arranged on only one face of the substrate 5 in FIG. 6. The multiple electronic components 4 and 4h at the side where the multiple columnar connection terminals 2 and 7 are not arranged may be sealed with the insulating resin 3 or may not be sealed with the insulating resin 3. The mounting of the multiple electronic components 4 and 4h on both faces of the substrate 5 allows the mounting density of the electronic components 4 and 4h heightened to reduce the size of the module board 1.

1 module board
2, 7 columnar connection terminal
3 insulating resin
4, 4h electronic component
5 substrate
6 top face
8 small area

The invention claimed is:

1. A module board comprising a substrate, a plurality of electronic components mounted on one face of the substrate, and an insulating resin sealing the plurality of electronic components, wherein a plurality of columnar connection terminals are arranged on a peripheral area of the substrate and in one or more predetermined areas on the substrate, and
wherein the one or more predetermined areas are areas of the substrate other than the peripheral area of the substrate where none of the plurality of electronic components are mounted.

2. The module board according to claim 1,
wherein the predetermined areas are set between the plurality of electronic components.

3. The module board according to claim 1,
wherein the plurality of electronic components include a lower electronic component and a higher electronic component in heights, and a distance between the lower electronic component and a columnar connection terminal arranged in the predetermined areas and most adjacent to the lower electronic component is less than a distance between the higher electronic component and a columnar connection terminal arranged in the predetermined areas and most adjacent to the higher electronic component.

4. The module board according to claim 1,
wherein the predetermined areas are set at a position farthest from the columnar connection terminals arranged on the peripheral area of the substrate.

5. The module board according to claim 4,
wherein the substrate has a rectangular shape, and
wherein the predetermined areas are set at a position including an intersection point of diagonal lines of the substrate.

6. The module board according to claim 4,
wherein the plurality of columnar connection terminals are arranged in a cross pattern in the predetermined areas.

7. The module board according to claim 1,
wherein the plurality of columnar connection terminals are connected to a ground electrode.

8. The module board according to claim 1,
wherein the plurality of electronic components include heat-variable electronic components, and the predetermined areas are set at a position adjacent to the heat-variable electronic components.

9. The module board according to claim 1,
wherein the insulating resin has a flat top face.

10. The module board according to claim 1,
wherein the plurality of electronic components are mounted on other face of the substrate.

11. The module board according to claim 2,
wherein the plurality of electronic components include a lower electronic component and a higher electronic component in heights, and a distance between the lower electronic component and a columnar connection terminal arranged in the predetermined areas and most adjacent to the lower electronic component is less than a distance between the higher electronic component and a columnar connection terminal arranged in the predetermined areas and most adjacent to the higher electronic component.

12. The module board according to claim 5,
wherein the plurality of columnar connection terminals are arranged in a cross pattern in the predetermined areas.

* * * * *